US011060020B2

(12) United States Patent
Kikuchi et al.

(10) Patent No.: US 11,060,020 B2
(45) Date of Patent: Jul. 13, 2021

(54) WAVELENGTH CONVERSION MEMBER

(71) Applicant: NGK Spark Plug Co., Ltd., Nagoya (JP)

(72) Inventors: Toshimitsu Kikuchi, Sendai (JP); Yoshifumi Tsutai, Sendai (JP); Takashi Abe, Sendai (JP); Ai Hayasaka, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 110 days.

(21) Appl. No.: 16/463,652

(22) PCT Filed: Dec. 4, 2017

(86) PCT No.: PCT/JP2017/043436
§ 371 (c)(1),
(2) Date: May 23, 2019

(87) PCT Pub. No.: WO2018/150686
PCT Pub. Date: Aug. 23, 2018

(65) Prior Publication Data
US 2019/0316034 A1 Oct. 17, 2019

(30) Foreign Application Priority Data
Feb. 17, 2017 (JP) .............................. JP2017-027636

(51) Int. Cl.
C09K 11/02 (2006.01)
C09K 11/64 (2006.01)

(52) U.S. Cl.
CPC ............ C09K 11/02 (2013.01); C09K 11/646 (2013.01)

(58) Field of Classification Search
None
See application file for complete search history.

(56) References Cited

U.S. PATENT DOCUMENTS

2010/0117511 A1  5/2010  Kawakami et al.
2011/0279012 A1  11/2011  Washizu et al.
(Continued)

FOREIGN PATENT DOCUMENTS

JP   H02-261642 A   10/1990
JP   2002-184357 A   6/2002
(Continued)

OTHER PUBLICATIONS

Japan Patent Office, International Search Report issued in International Stage of subject Application, International Application No. PCT/JP2017/043436, dated Feb. 27, 2018.
(Continued)

Primary Examiner — Jeffrey D Washville
(74) Attorney, Agent, or Firm — Stites & Harbison, PLLC; Jeffrey A. Haeberlin; James R. Hayne

(57) ABSTRACT

A wavelength conversion member is provided which includes a phosphor layer having an increased pencil hardness and thereby has a reduced risk of breakage such as scattering of fragments of the phosphor layer or separation of the phosphor layer.
A substrate 12 is made of sapphire, and a phosphor layer 14 is disposed on the substrate 12 and includes phosphor particles 16 and a light transmissive inorganic material 22. The phosphor layer 14 has a pencil hardness of 5B or above. The high hardness of the phosphor layer 14 reduces the risk of breakage such as the phosphor layer 14 being scattered as fragments or being separated from the substrate 12.

5 Claims, 5 Drawing Sheets

(56) References Cited

U.S. PATENT DOCUMENTS

| | | | |
|---|---|---|---|
| 2012/0256223 A1* | 10/2012 | Washizu | H01L 33/501 257/98 |
| 2013/0257264 A1 | 10/2013 | Tamaki et al. | |
| 2015/0159836 A1 | 6/2015 | Tamaki et al. | |
| 2015/0353417 A1 | 12/2015 | Mori et al. | |
| 2016/0060517 A1* | 3/2016 | Pohl-Klein | C04B 35/584 257/98 |
| 2016/0149097 A1 | 5/2016 | Saka et al. | |
| 2018/0039006 A1 | 2/2018 | Gotou | |

FOREIGN PATENT DOCUMENTS

| | | |
|---|---|---|
| JP | 2004-200531 A | 7/2004 |
| JP | 2007-014217 A | 1/2007 |
| JP | 2007-142173 A | 6/2007 |
| JP | 2007-246873 A | 9/2007 |
| JP | 2010-118532 A | 5/2010 |
| JP | 2013-247067 A | 12/2013 |
| JP | 2014-116587 A | 6/2014 |
| JP | 2014-145012 A | 8/2014 |
| JP | 2016-159445 A | 9/2016 |
| JP | 2016-527163 A | 9/2016 |
| WO | 2011-077548 A1 | 6/2011 |
| WO | 2016-158370 A1 | 10/2016 |

OTHER PUBLICATIONS

European Patent Office, Extended European Search Report issued in corresponding Application No. 17897082.8, dated Dec. 16, 2020.
Japan Patent Office, Office Action (Notice of Reasons for Refusal) issued in corresponding Application No. JP 2017-027636, dated Jan. 12, 2021.
Korean Intellectual Property Office, Office Action (Notification of Reason for Refusal) issued in corresponding Application No. 10-2019-7014482, dated Nov. 13, 2020.

* cited by examiner

FIG. 1
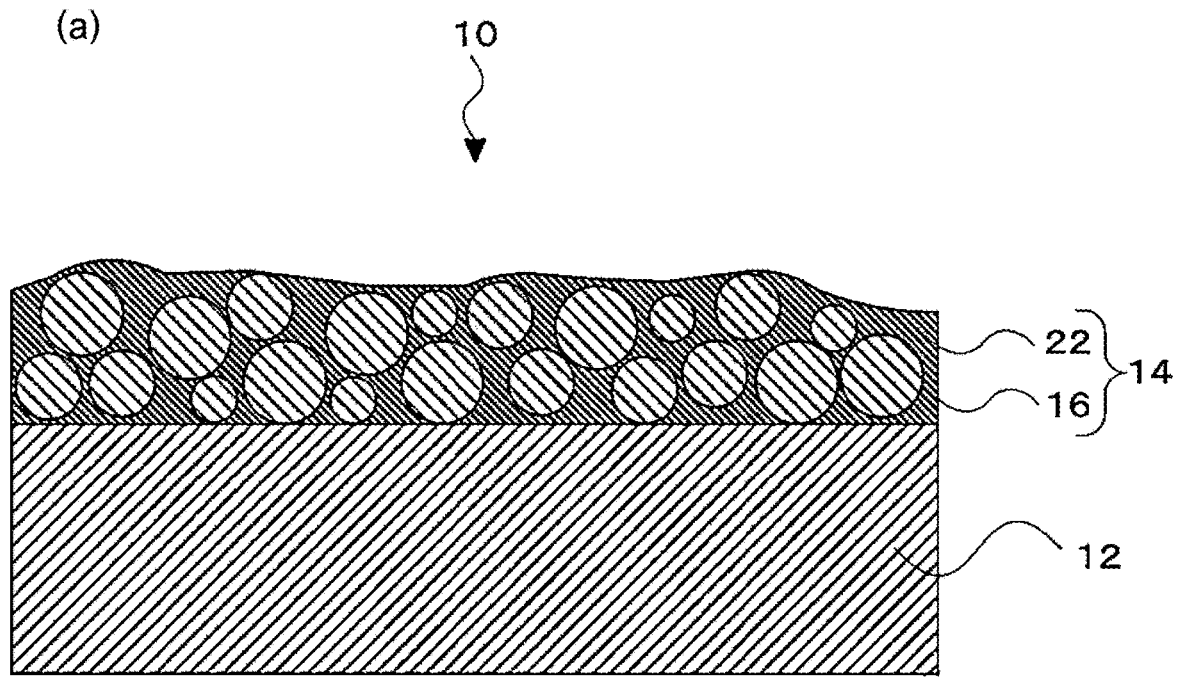
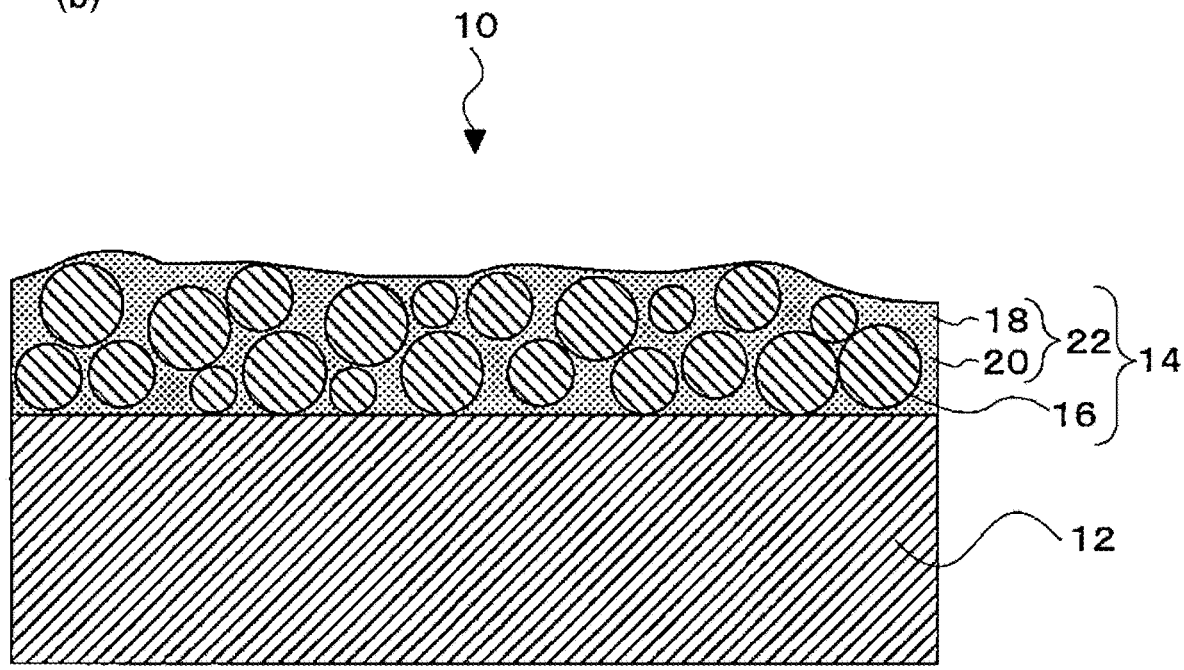

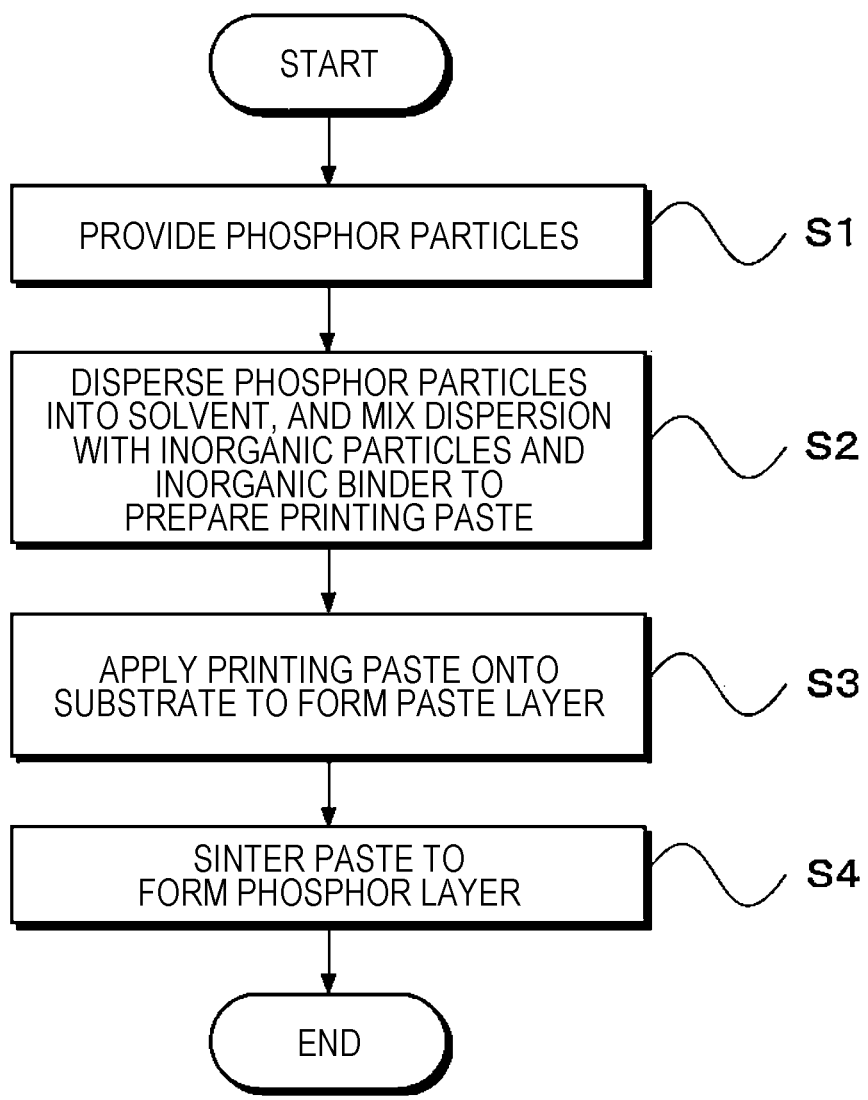

FIG. 3

○ SAPPHIRE SUBSTRATE

| TYPE AND AVERAGE PARTICLE SIZE OF NANOPARTICLES | | CONTENT OF NANOPARTICLES (WEIGHT RATIO AFTER SINTERING, RELATIVE TO TOTAL) | | | | | | |
|---|---|---|---|---|---|---|---|---|
| | | 0% | 1.2% | 2.5% | 6.0% | 11.6% | 16.9% | 21.7% |
| SiO₂ | 7 nm | 6B | 6B | 6B | 4B | LESS THAN 6B | LESS THAN 6B | |
| | 10 nm | | 6B | 2B | 2B | 4B | 5B | DIFFICULT PRINTING |
| | 12 nm | | 5B | B | 2B | 3B | 4B | |
| | 40 nm | | 6B | 2B | B | 3B | 4B | |
| | 60 nm | | 6B | 4B | 3B | 4B | 5B | |
| | 80 nm | | 6B | 6B | 5B | 6B | LESS THAN 6B | |
| | 100 nm | | 6B | 6B | 6B | LESS THAN 6B | LESS THAN 6B | |
| Al₂O₃ | 10 TO 20 nm | | 5B | 3B | F | F | 2B | 6B |
| | 40 nm | | 6B | 3B | 2B | 2B | 3B | LESS THAN 6B |
| | 60 nm | | 6B | 5B | 4B | 4B | 5B | LESS THAN 6B |
| | 80 nm | | 6B | 6B | 6B | 5B | LESS THAN 6B | LESS THAN 6B |
| | 100 nm | | 6B | 6B | 6B | 6B | LESS THAN 6B | LESS THAN 6B |

PENCIL HARDNESS : 6B < 5B < ···· < B < HB < F < H < ···· < 9H

FIG. 4

○ Al+Ag SUBSTRATE

| TYPE AND AVERAGE PARTICLE SIZE OF NANOPARTICLES | | CONTENT OF NANOPARTICLES (WEIGHT RATIO AFTER SINTERING, RELATIVE TO TOTAL) | | | | | | |
|---|---|---|---|---|---|---|---|---|
| | | 0% | 1.2% | 2.5% | 6.0% | 11.6% | 16.9% | 21.7% |
| SiO₂ | 7 nm | 4B | 4B | 4B | 3B | 5B | LESS THAN 6B | |
| | 10 nm | | 4B | 2B | B | 3B | 3B | DIFFICULT PRINTING |
| | 12 nm | | 3B | 2B | F | 2B | 3B | |
| | 40 nm | | 4B | 2B | B | 3B | 3B | |
| | 60 nm | | 4B | 3B | 2B | 3B | 3B | |
| | 80 nm | | 4B | 4B | 5B | 6B | LESS THAN 6B | |
| | 100 nm | | 4B | 4B | 5B | LESS THAN 6B | LESS THAN 6B | |
| Al₂O₃ | 10 TO 20 nm | | 4B | 2B | 2H | 6H OR MORE | 2B | 5B |
| | 40 nm | | 4B | 2B | 2B | 2B | 3B | 6B |
| | 60 nm | | 4B | 3B | 3B | 3B | 3B | LESS THAN 6B |
| | 80 nm | | 4B | 4B | 4B | 4B | 5B | LESS THAN 6B |
| | 100 nm | | 4B | 4B | 5B | 5B | 6B | LESS THAN 6B |

PENCIL HARDNESS : 6B < 5B < ···· < B < HB < F < H < ···· < 9H

FIG. 5
(a)
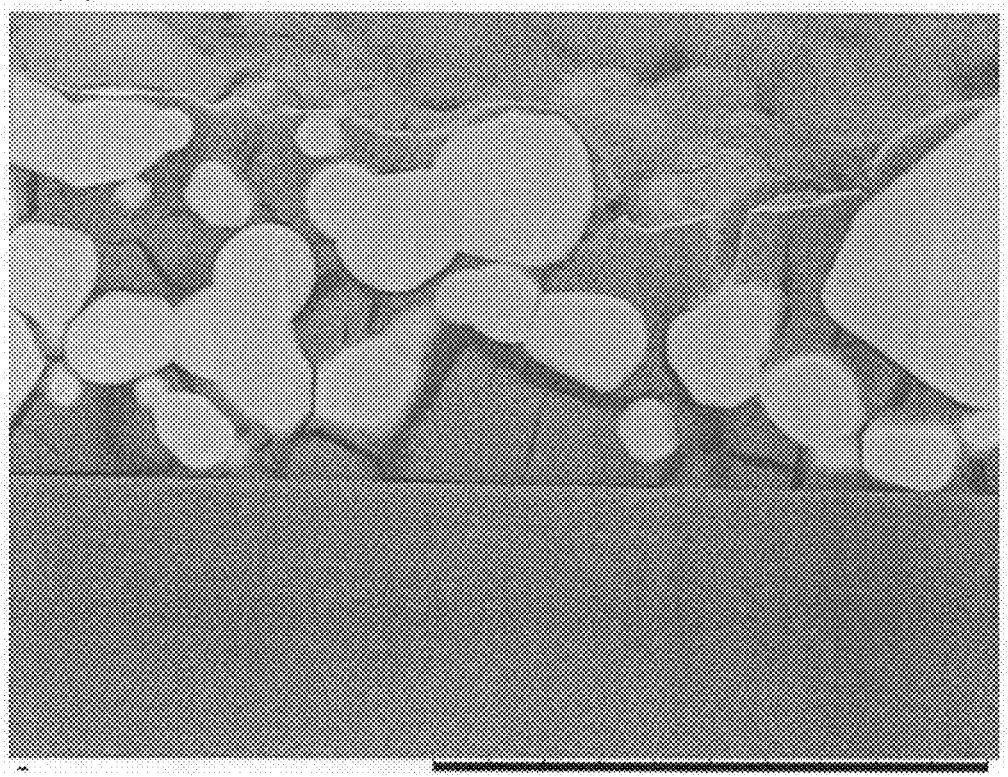
(b)
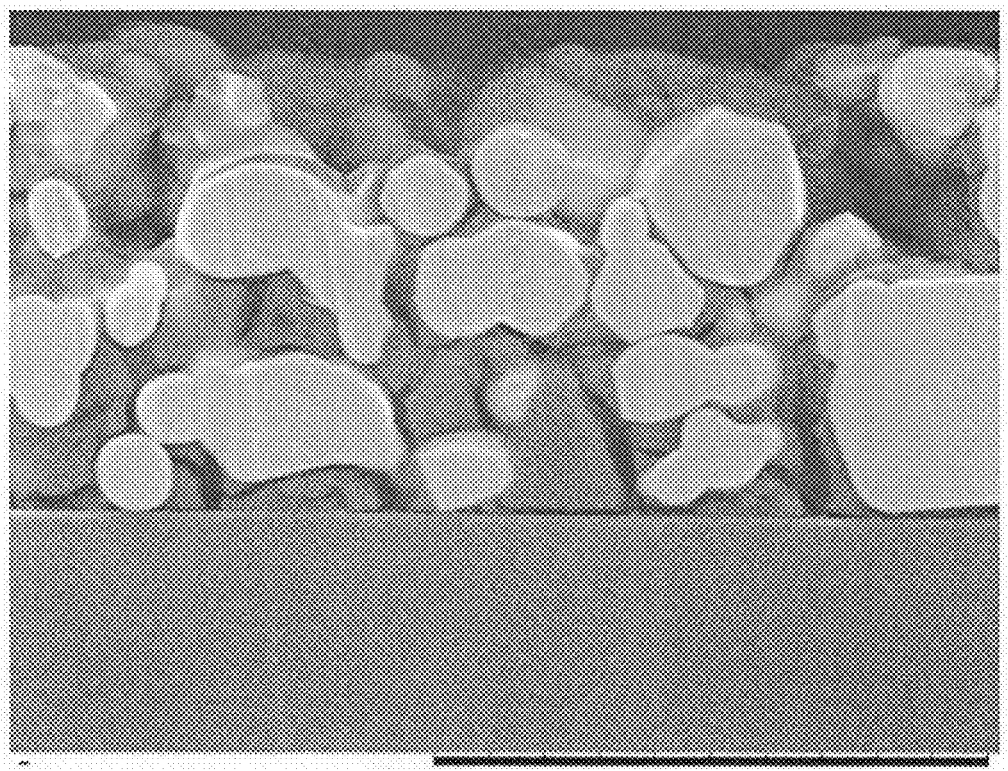

WAVELENGTH CONVERSION MEMBER

TECHNICAL FIELD

The present invention relates to a wavelength conversion member including phosphor particles.

BACKGROUND ART

Light-emitting devices having phosphors utilize the phenomenon in which the phosphor absorbs light from a light source such as an LED and is excited to emit converted light with a wavelength differing from that of the absorbed light. In recent years, high-output laser diodes (LDs) which have high energy efficiency and are easily adaptable to miniaturization and high energy density are used as excitation sources in an increasing number of applications.

A phosphor was conventionally dispersed in a resin such as epoxy or silicone. This structure, however, was incapable of attaining a long life due to the resin being burnt when irradiated with laser light. An approach to solving this problem is to use inorganic binders in place of resins, and wavelength conversion members including exclusively inorganic materials have been developed. Such wavelength conversion members are successful in solving the problem of heat resistance when used in combination with a high-energy excitation source such as a laser.

Patent Literature 1 discloses a surface mounted LED element in which an LED chip and its periphery are buried with a dispersion of a phosphor in a low-melting glass binder, and the surrounding is further filled with a low-melting glass filler.

Patent Literature 2 discloses a light-emitting device which has a wavelength conversion section composed of a ceramic layer formed from a polysilazane containing a phosphor and inorganic particles finer than the phosphor. This light-emitting device does not involve a high-temperature sintering process by virtue of the polysilazane containing a specific amount of inorganic fine particles, and is also resistant to moisture permeation as a result of voids being buried with the inorganic fine particles.

CITATION LIST

Patent Literature

PTL 1: Japanese Unexamined Patent Application Publication No. 2004-200531
PTL 2: WO 2011/077548

SUMMARY OF INVENTION

Technical Problem

Unfortunately, as described in the patent literatures mentioned above, the inorganic binders used in the conventional art are brittle materials, and the shrinkage of the inorganic binder itself during heat treatment in the fabrication of wavelength conversion members can cause cracks within the inorganic binder or gaps between the binder and phosphor particles. Such cracks or gaps decrease the strength of wavelength conversion members and increase the risk of breakage such as scattering of fragments of the phosphor layer or separation of the phosphor layer.

The present invention has been made in light of the circumstances discussed above. It is therefore an object of the invention to provide a wavelength conversion member which includes a phosphor layer having an increased pencil hardness and thereby has a reduced risk of breakage such as scattering of fragments of the phosphor layer or separation of the phosphor layer.

Solution to Problem (1) To achieve the above object, a wavelength conversion member of the present invention includes a substrate made of sapphire, and a phosphor layer disposed on the substrate and including phosphor particles and a light transmissive inorganic material, the phosphor layer having a pencil hardness of 5 B or above.

The high hardness of the phosphor layer reduces the risk of breakage such as the phosphor layer being scattered as fragments or being separated from the substrate.

(2) A wavelength conversion member of the present invention includes a substrate mainly made of aluminum, and a phosphor layer disposed on the substrate and including phosphor particles and a light transmissive inorganic material, the phosphor layer having a pencil hardness of 3 B or above. The high hardness of the phosphor layer reduces the risk of breakage such as the phosphor layer being scattered as fragments or being separated from the substrate.

(3) A wavelength conversion member of the present invention includes a substrate, and a phosphor layer disposed on the substrate and including phosphor particles and a light transmissive inorganic material, the inorganic material including a binding material which binds the substrate and the phosphor particles together, the inorganic material including inorganic particles having an average particle size of not less than 10 nm and not more than 60 nm, the inorganic particles representing not less than 2.5 wt % and not more than 17.0 wt % of the inorganic material. Due to the wavelength conversion member containing 10 nm to 60 nm inorganic particles, the amount of shrinkage of the inorganic binder during production steps can be reduced, the occurrence of internal cracks serving as origins of breakage can be suppressed, and consequently the hardness can be enhanced.

(4) In the wavelength conversion member of the invention, the inorganic particles may be $SiO_2$ particles having an average particle size of not less than 10 nm and not more than 40 nm, and may represent not less than 2.5 wt % and not more than 6.0 wt % of the inorganic material. With this configuration, the amount of shrinkage of the inorganic binder during production steps can be reduced, and the hardness can be enhanced.

(5) In the wavelength conversion member of the invention, the inorganic particles may be $Al_2O_3$ particles having an average particle size of not less than 10 nm and not more than 20 nm, and may represent not less than 6.0 wt % and not more than 12.0 wt % of the inorganic material. With this configuration, the amount of shrinkage of the inorganic binder during production steps can be reduced, and the hardness can be enhanced.

Advantageous Effects of Invention

The wavelength conversion members according to the present invention include a phosphor layer having an increased hardness, and thereby attain a reduced risk of breakage such as the phosphor layer being scattered as fragments or being separated from the substrate.

BRIEF DESCRIPTION OF DRAWINGS

FIGS. 1(a) and 1(b) are each a schematic view illustrating a wavelength conversion member of the present invention.

FIG. 2 is a flow chart illustrating a method for producing a wavelength conversion member of the present invention.

FIG. 3 is a table describing the conditions and results of a pencil hardness test of wavelength conversion members having a substrate made of sapphire.

FIG. 4 is a table describing the conditions and results of a pencil hardness test of wavelength conversion members having a substrate made of aluminum and silver.

FIGS. 5(a) and 5(b) are sectional SEM images of wavelength conversion members of Example and Comparative Example, recessively.

DESCRIPTION OF EMBODIMENTS

Next, embodiments of the present invention will be described with reference to the drawings. To facilitate the understanding of the description, the same reference numerals will be used for the same elements in the drawings, and overlaps in the description will be omitted. In the drawings, the size of the elements is only illustrative and is not necessarily to actual scale.

[Configuration of Wavelength Conversion Members]

FIGS. 1(a) and 1(b) are each a schematic view illustrating a wavelength conversion member 10 of the present invention. In the wavelength conversion member 10, a phosphor layer 14 is disposed on a substrate 12. The wavelength conversion member 10 absorbs light from a light source and is thereby excited to generate light with a wavelength differing from that of the absorbed light, while transmitting or reflecting the source light. For example, the phosphor layer 14 may absorb blue light and convert it to green, red and yellow lights while transmitting or reflecting the blue absorption light, and may emit light of various colors by using the converted light alone or combining the converted light and the absorption light.

The substrate 12 may be made of a material such as sapphire, aluminum or glass. A transmissive substrate is produced from a light transmissive material. A reflective substrate may be made of a light-reflecting material in its entirety, or may be made of a light transmissive material having a surface coated, for example plated, with a light-reflecting material. From the point of view of emission intensity, the portion through which light passes is made of a material that hardly absorbs at least the absorption light. Because the temperature is raised by the application of high-energy light, a material having high thermal conductivity is preferable. A preferred transmissive substrate is one made of sapphire, which has high thermal conductivity and high light transmitting properties. A preferred reflective substrate is one made of aluminum, which has high thermal conductivity and high light reflectance. For example, silver may be plated or deposited on the surface of aluminum. The substrate 12 is preferably a plate.

The phosphor layer 14 is provided as a film on the substrate 12, and is formed of phosphor particles 16 and an inorganic material 22. In FIG. 1(b), the portion of the phosphor layer 14 except the phosphor particles 16 is inorganic particles 18 and a binding material 20, the inorganic particles 18 being shown as dots. While the inorganic material 22 is composed of the inorganic particles 18 and the binding material 20, where the inorganic particles 18 are made of the same substance as the binding material 20, the inorganic particles 18 and the binding material 20 are sometimes combined into a single unit and indistinguishable from each other as shown in FIG. 1(a), or the inorganic particles 18 and the binding material 20 are sometimes distinguishable as seen in FIG. 1(b).

The binding material 20 binds the phosphor particles 16, the inorganic particles 18 and the substrate 12 together. Because the layer is joined to the substrate 12 serving as a dissipator, heat can be released efficiently, and the phosphor can be prevented from thermal quenching when irradiated with light having high energy density. The thickness of the phosphor layer 14 may be not less than 2 μm and not more than 400 μm, and may be preferably not less than 5 μm and not more than 200 μm.

For example, the phosphor particles 16 may be an yttrium/aluminum/garnet-based phosphor (YAG-based phosphor) and a lutetium/aluminum/garnet-based phosphor (LAG-based phosphor). Further, the phosphor particles 16 may be selected from the following materials in accordance with the design of a color to be emitted. Examples of such phosphors include blue phosphors such as $BaMgAl_{10}O_{17}$:Eu, ZnS:Ag, Cl, $BaAl_2S_4$:Eu and $CaMgSi_2O_6$:Eu, yellow or green phosphors such as $Zn_2SiO_4$:Mn, $(Y,Gd)BO_3$:Tb, ZnS:Cu,Al, $(M1)_2SiO_4$:Eu, (M1) $(M2)_2$S:Eu, $(M3)_3Al_5O_{12}$:Ce, SiAlON:Eu, CaSiAlON:Eu, $(M1)Si_2O_2N$:Eu and $(Ba,Sr,Mg)_2SiO_4$:Eu,Mn, yellow, orange or red phosphors such as $(M1)_3SiO_5$:Eu and (M1)S:Eu, and red phosphors such as $(Y,Gd)BO_3$:Eu, $Y_2O_2S$:Eu, $(M1)_2Si_5N_8$:Eu, $(M1)AlSiN_3$:Eu and $YPVO_4$:Eu. In these formulae, M1 includes at least one selected from the group consisting of Ba, Ca, Sr and Mg, M2 includes at least one of Ga and Al, and M3 includes at least one selected from the group consisting of Y, Gd, Lu and Te. The phosphor particles 16 described above are only examples, and the phosphor particles 16 used in the wavelength conversion member 10 are not necessarily limited to those mentioned above.

The binding material 20 is composed of a light transmissive inorganic material that is a product of the hydrolysis or oxidation of an inorganic binder. For example, the binding material 20 is composed of silica ($SiO_2$) or aluminum phosphate. Because the binding material 20 is an inorganic material, it is not denatured even when irradiated with high-energy light such as light from a laser diode. Further, because the binding material 20 has light transmitting properties, the absorption light and the converted light can pass therethrough. Examples of the inorganic binders include ethyl silicate and aqueous aluminum phosphate solution.

The inorganic particles 18 are added to the inorganic binder during a production step to reduce the amount of shrinkage of the inorganic binder during the production steps and also to reduce the occurrence of internal cracks serving as origins of breakage, making it possible to enhance the hardness of the phosphor layer 14. The inorganic particles 18 have optical transparency at near ultraviolet to near infrared wavelengths, and have a particle size far below the wavelength of the source light (absorption light) that is used, thereby reducing the scattering of light by the inorganic particles 18. For example, it is recommended that the average particle size be not more than one tenth of the wavelength of the absorption light.

The substance forming the inorganic particles 18 may be the same as or different from the substance forming the binding material 20. The inorganic particles 18 are preferably one or more selected from the group consisting of $SiO_2$, $Al_2O_3$, $ZrO_2$ and $TiO_2$. The average particle size of the inorganic particles 18 is not less than 10 nm and not more than 60 nm. If the average particle size is too small, the primary particles are aggregated and are not dispersed in a favorable manner. Too large particles significantly scatter light to adversely affect optical properties. The shape of the inorganic particles is preferably closer to sphere. It is preferable that the particles have a narrow grain size distribution and the maximum particle size be not more than 100 nm.

When, for example, $SiO_2$ particles are used as the inorganic particles 18, the average particle size is more preferably not less than 10 nm and not more than 40 nm. When the inorganic particles 18 are $Al_2O_3$ particles, the average particle size is more preferably not less than 10 nm and not more than 20 nm.

The inorganic particles 18 represent not less than 2.5 wt % and not more than 17.0 wt % of the mass of the phosphor layer 14 except the phosphor particles 16 (the mass of the inorganic material 22 that is the total of the binding material 20 and the inorganic particles 18). When, for example, $SiO_2$ particles are used as the inorganic particles 18, the proportion is more preferably not less than 2.5 wt % and not more than 6.0 wt %. When the inorganic particles 18 are $Al_2O_3$ particles, the proportion is more preferably not less than 6.0 wt % and not more than 12.0 wt %.

The term "light transmissive" substance or the phrase that a substance has "light transmitting properties" means that when light with a visible light wavelength ($\lambda$=380–780 nm) is applied vertically onto the substance 0.5 mm in thickness, the radiant flux of light passed to the other side is more than 80% of that of the incident light.

The wavelength conversion member 10 of the invention may be combined with a light source to constitute a light-emitting device. Because the phosphor layer 14 is composed of the inorganic material 22, the wavelength conversion member 10 may be used in combination with, for example, a high-output laser diode as the light source, thus constituting a high-output light-emitting device. Further, because the phosphor layer 14 has high surface hardness, the life of such a light-emitting device can be extended.

[Methods for Producing Wavelength Conversion Members]

An example method for producing a wavelength conversion member will be described. FIG. 2 is a flow chart illustrating a method for producing a wavelength conversion member of the present invention. First, a printing paste is prepared. First, phosphor particles are provided (Step S1). The phosphor particles may be, for example, YAG and LAG particles. The average particle size of the phosphor particles is not less than 1 μm and not more than 30 μm, and is preferably not less than 5 μm and not more than 20 μm. In the present specification, the average particle size indicates the median diameter (D50). The average particle size may be measured by a dry process or wet process using a laser diffraction/scattering particle size distribution analyzer.

Next, the phosphor particles provided are dispersed into a solvent, and the dispersion is mixed together with inorganic particles and an inorganic binder to give a printing paste (Step S2). The mixing may be performed using a ball mill or the like. The solvent may be a high-boiling solvent such as α-terpineol, butanol, isophorone or glycerol.

The inorganic binder is preferably an organic silicate such as ethyl silicate. The use of an organic silicate allows the inorganic particles to be dispersed, and the printing paste that is obtained attains an appropriate viscosity. When, for example, ethyl silicate is used as the inorganic binder, the mass of the ethyl silicate is controlled to not less than 10 wt % and not more than 150 wt %, or preferably not less than 30 wt % and not more than 100 wt % relative to the mass of water and a catalyst. Alternatively, the inorganic binder may be one obtained by reaction at room temperature or heat treatment at 500° C. or below of a raw material including at least one selected from the group consisting of silicon oxide precursors capable of forming silicon oxide by hydrolysis or oxidation, silicic acid compounds, silica and amorphous silica. Examples of the silicon oxide precursors include those based on perhydropolysilazane, ethyl silicate and methyl silicate.

The amount in which the inorganic particles are mixed is not less than 1.0 wt % and not more than 7.5 wt % of the total of the mass of the inorganic particles and the mass of the inorganic binder. By mixing the inorganic binder and the inorganic particles in the above ratio, the printing paste that is obtained is a good dispersion of the inorganic particles having an appropriate viscosity. When, for example, $SiO_2$ particles are used as the inorganic particles, the amount thereof is more preferably not less than 1.0 wt % and not more than 2.5 wt %. When the inorganic particles are $Al_2O_3$ particles, the amount thereof is more preferably not less than 2.5 wt % and not more than 5.0 wt %.

After the printing paste has been prepared, the printing paste is applied onto a substrate to form a paste layer (Step S3). The printing paste may be applied by screen printing, spraying, dispenser drawing or inkjetting. A screen printing method is preferable for the reason that a thin paste layer can be formed stably. The thickness of the paste layer is preferably not less than 10 μm and not more than 200 μm.

The paste layer formed on the substrate is sintered into a phosphor layer (Step S4). The sintering temperature is preferably not less than 150° C. and not more than 500° C., and the sintering time is preferably not less than 0.5 hours and not more than 2.0 hours. The heat-up rate is preferably not less than 50° C./h and not more than 200° C./h. A drying step may be performed before the sintering.

By the production steps described above, a wavelength conversion member can be easily manufactured which has an increased surface hardness and has a reduced risk of breakage such as scattering of fragments of the phosphor layer or separation of the phosphor layer. Because the phosphor layer in the wavelength conversion member of the invention is composed of inorganic materials, the wavelength conversion member may be suitably used in a light-emitting device using a high-output laser diode as an excitation source. Further, because the phosphor layer has high surface hardness, the life of such a light-emitting device can be extended.

EXAMPLES AND COMPARATIVE EXAMPLES (Sample Preparation Method)

Phosphor particles (YAG particles) and a-terpineol (solvent) were mixed together to give a dispersion. Separately, mixed binders were prepared by admixing, with ethyl silicate (inorganic binder), $SiO_2$ particles (inorganic particles) having an average particle size of 7 nm to 100 nm or $Al_2O_3$ particles (inorganic particles) having an average particle size of 10 nm to 100 nm in a ratio of 0 to 10.0 wt % relative to the total of the mass of the inorganic particles and the mass of the inorganic binder. This ratio corresponds to 0 to 21.7 wt % proportion after sintering. $SiO_2$ particles with an average particle size of less than 7 nm, and $Al_2O_3$ particles with an average particle size of less than 10 nm were not used in the experiments because these particles were difficult to prepare or would be aggregated due to the average particle size being too small.

Next, printing pastes were prepared by mixing the mixed binder with the dispersion in a ratio of 50 wt % for the binder relative to the total of the mass thereof and the mass of the dispersion. The printing pastes were applied onto sapphire substrates and substrates mainly made of aluminum and silver (MIRO2 SILVER manufactured by Alanod) by a screen printing method so that the film thickness would be 30 μm. After the application, the films were dried at 100° C. for 20 minutes, and pores were buried with the inorganic binder. The temperature was then increased to 350° C. at 150° C./h, and thereby the films were sintered for 30 minutes. Samples were thus prepared.

(Sample Evaluation Method)

FIGS. 3 and 4 are tables describing the conditions and results of a pencil hardness test of wavelength conversion members having a sapphire substrate and wavelength conversion members having a substrate made of aluminum and silver, respectively. In the pencil hardness test, the samples were tested by scratch hardness testing (pencil method) in accordance with JIS K5600-5-4 to determine the film strength of the phosphor layer.

When the substrate was sapphire and the nanoparticles (inorganic particles) were $SiO_2$, all the samples which had an average particle size of the nanoparticles of 10 nm to 60 nm and a content of the nanoparticles of 2.5 wt % to 16.9 wt % attained high pencil hardness compared to the samples having a sapphire substrate and containing no nanoparticles. In particular, higher pencil hardness was achieved when the samples had an average particle size of 10 to 40 nm and contained 2.5 to 6.0 wt % nanoparticles.

When the substrate was sapphire and the nanoparticles were $Al_2O_3$, all the samples which had an average particle size of the nanoparticles of 10 nm to 60 nm and a content of the nanoparticles of 2.5 wt % to 16.9 wt % attained high pencil hardness compared to the samples having a sapphire substrate and containing no nanoparticles. In particular, higher pencil hardness was achieved when the samples had an average particle size of 10 to 20 nm and contained 6.0 to 11.6 wt % nanoparticles.

When the substrate was made of aluminum and silver, and the nanoparticles were $SiO_2$, all the samples which had an average particle size of the nanoparticles of 10 nm to 60 nm and a content of the nanoparticles of 2.5 wt % to 16.9 wt % attained high pencil hardness compared to the samples having an aluminum silver substrate and containing no nanoparticles. In particular, higher pencil hardness was achieved when the samples had an average particle size of 10 to 40 nm and contained 2.5 to 6.0 wt % nanoparticles.

When the substrate was made of aluminum and silver, and the nanoparticles were $Al_2O_3$, all the samples which had an average particle size of the nanoparticles of 10 nm to 60 nm and a content of the nanoparticles of 2.5 wt % to 16.9 wt % attained high pencil hardness compared to the samples having an aluminum silver substrate and containing no nanoparticles. In particular, higher pencil hardness was achieved when the samples had an average particle size of 10 to 20 nm and contained 6.0 to 11.6 wt % nanoparticles.

Some of the samples showed high pencil hardness even outside the above numerical ranges. Incidentally, when the nanoparticles were $SiO_2$ and the content of the nanoparticles was 21.7 wt %, printing was difficult and the measurement of pencil hardness was infeasible regardless of the type of the substrate and the average particle size.

The results will be summarized about the nanoparticles. When the nanoparticles were $SiO_2$, the samples which had an average particle size of 10 to 40 nm and contained 2.5 to 6.0 wt % nanoparticles attained higher pencil hardness. Thus, where the nanoparticles are $SiO_2$, it is more preferable that the average particle size be 10 to 40 nm and the content of the nanoparticles be 2.5 to 6.0 wt % irrespective of the material of the substrate.

When the nanoparticles were $Al_2O_3$, the samples which had an average particle size of 10 to 20 nm and contained 6.0 to 11.6 wt % nanoparticles attained higher pencil hardness. Thus, where the nanoparticles are $Al_2O_3$, it is more preferable that the average particle size be 10 to 20 nm and the content of the nanoparticles be 6.0 to 12.0 wt % irrespective of the material of the substrate.

FIGS. 5(a) and 5(b) are sectional SEM images of wavelength conversion members of Example and Comparative Example, recessively. FIG. 5(a) is a sectional SEM image of a wavelength conversion member fabricated by coating a sapphire substrate with $SiO_2$ particles having an average particle size of 12 nm so that the content of the particles after sintering would be 6.0 wt %. FIG. 5(b) is a sectional SEM image of a wavelength conversion member fabricated without adding inorganic particles to a sapphire substrate. The images show that the phosphor layer of the wavelength conversion member containing the inorganic particles (Example) has less and smaller cracks as compared to the phosphor layer of the wavelength conversion member containing no inorganic particles (Comparative Example). Thus, the occurrence of cracks can be reduced by adding inorganic particles to an inorganic material which forms a phosphor layer.

From the results discussed above, it has been shown that the wavelength conversion members according to the present invention, due to their containing a phosphor layer with high hardness, attain a reduced risk of breakage such as the phosphor layer being scattered as fragments or being separated from the substrate.

REFERENCE SIGNS LIST

10 WAVELENGTH CONVERSION MEMBER
12 SUBSTRATE
14 PHOSPHOR LAYER
16 PHOSPHOR PARTICLE
18 INORGANIC PARTICLE
20 BINDING MATERIAL
22 INORGANIC MATERIAL

The invention claimed is:

1. A wavelength conversion member comprising:
a substrate made of sapphire, and
a phosphor layer disposed on the substrate and including phosphor particles and a light transmissive inorganic material,
the phosphor layer having a pencil hardness of 5B or above.

2. A wavelength conversion member comprising:
a substrate mainly made of aluminum, and
a phosphor layer disposed on the substrate and including phosphor particles and a light transmissive inorganic material,
the phosphor layer having a pencil hardness of 3B or above.

3. A wavelength conversion member comprising:
a substrate made of sapphire or mainly made of aluminum, and
a phosphor layer disposed on the substrate and including phosphor particles and a light transmissive inorganic material,
the inorganic material including a binding material which binds the substrate and the phosphor particles together, the inorganic material including inorganic particles having an average particle size of not less than 10 nm and not more than 60 nm, the inorganic particles representing not less than 2.5 wt % and not more than 17.0 wt % of the inorganic material, and the phosphor layer having a pencil hardness of 5B or above.

4. The wavelength conversion member according to claim 3, wherein the inorganic particles are $SiO_2$ particles having an average particle size of not less than 10 nm and not more than 40 nm, and represent not less than 2.5 wt % and not more than 6.0 wt % of the inorganic material.

5. The wavelength conversion member according to claim 3, wherein the inorganic particles are $Al_2O_3$ particles having an average particle size of not less than 10 nm and not more than 20 nm, and represent not less than 6.0 wt % and not more than 12.0 wt % of the inorganic material.

* * * * *